United States Patent
Hseih et al.

(10) Patent No.: US 11,488,999 B2
(45) Date of Patent: Nov. 1, 2022

(54) ACTIVE DEPTH SENSING IMAGE SENSOR

(71) Applicant: QUALCOMM Incorporated, San Diego, CA (US)

(72) Inventors: Biay-Cheng Hseih, Irvine, CA (US); Sergiu Radu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 417 days.

(21) Appl. No.: 16/735,084

(22) Filed: Jan. 6, 2020

(65) Prior Publication Data

US 2021/0210543 A1    Jul. 8, 2021

(51) Int. Cl.
- *H01L 27/146*    (2006.01)
- *H04N 5/369*    (2011.01)
- *G01S 17/86*    (2020.01)
- *G01S 17/894*    (2020.01)

(52) U.S. Cl.
CPC ........ *H01L 27/14643* (2013.01); *G01S 17/86* (2020.01); *G01S 17/894* (2020.01); *H01L 27/14603* (2013.01); *H04N 5/36965* (2018.08)

(58) Field of Classification Search
CPC ........ H01L 27/14643; H01L 27/14603; H01L 27/1461; G01S 17/86; G01S 17/894; G01S 7/4816; G01S 7/4914; G01S 17/93; G01S 17/36; H04N 5/36965
See application file for complete search history.

(56) References Cited

U.S. PATENT DOCUMENTS

| | | | |
|---|---|---|---|
| 9,640,702 B2 * | 5/2017 | Knoll | H01L 31/105 |
| 9,806,112 B1 * | 10/2017 | Celo | H01L 27/1443 |
| 10,244,188 B2 * | 3/2019 | Saylor | H04N 5/33 |
| 10,545,240 B2 * | 1/2020 | Campbell | G01S 7/4808 |
| 2018/0247968 A1 | 8/2018 | Na et al. | |
| 2018/0284286 A1 | 10/2018 | Eichenholz et al. | |

OTHER PUBLICATIONS

International Search Report and Written Opinion—PCT/US2020/064877—ISA/EPO—dated Mar. 4, 2021.

\* cited by examiner

*Primary Examiner* — Seung C Sohn
(74) *Attorney, Agent, or Firm* — Qualcomm Incorporated

(57) ABSTRACT

Aspects of the present disclosure relate to an image sensor. An example apparatus includes an image sensor including one or more pixels. Each pixel of the one or more pixels includes a photodetector, and the photodetector includes a photosensitive surface including germanium. In some implementations, the photodetector includes a photodiode including an intrinsic silicon layer doped with germanium or including germanium crystals. The intrinsic layer may be between a p− layer and an n− layer not including germanium. The intrinsic layer may be configured to absorb photons of the light received at the intrinsic layer. The light may include one or more reflections of an emitted light for active depth sensing. For example, the emitted light may be frequency modulated and having a first wavelength for indirect time-of-flight depth sensing. Sampling circuits may generate voltages indicating a phase difference between the emitted light and a reflection of the emitted light.

30 Claims, 12 Drawing Sheets

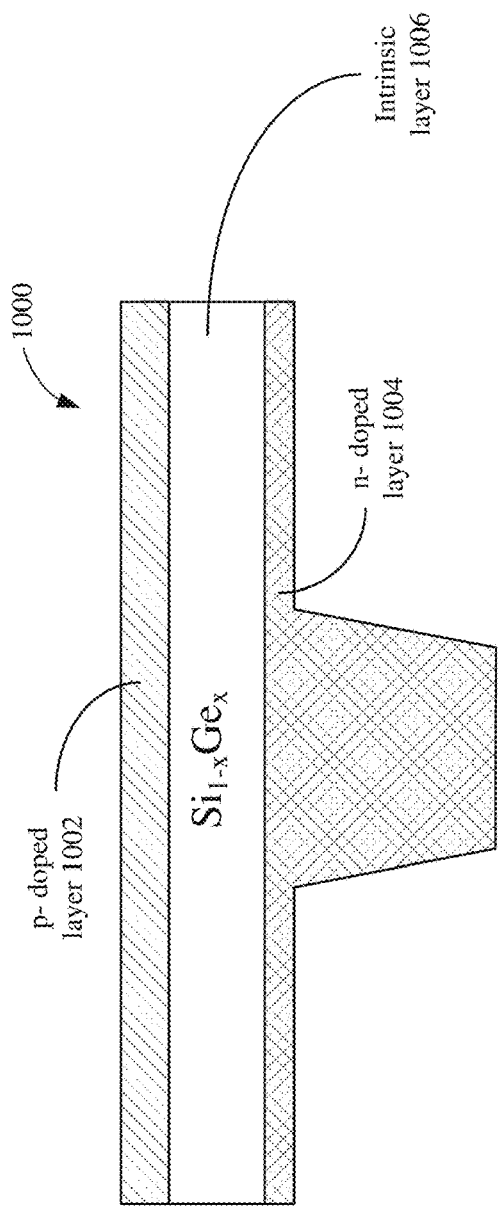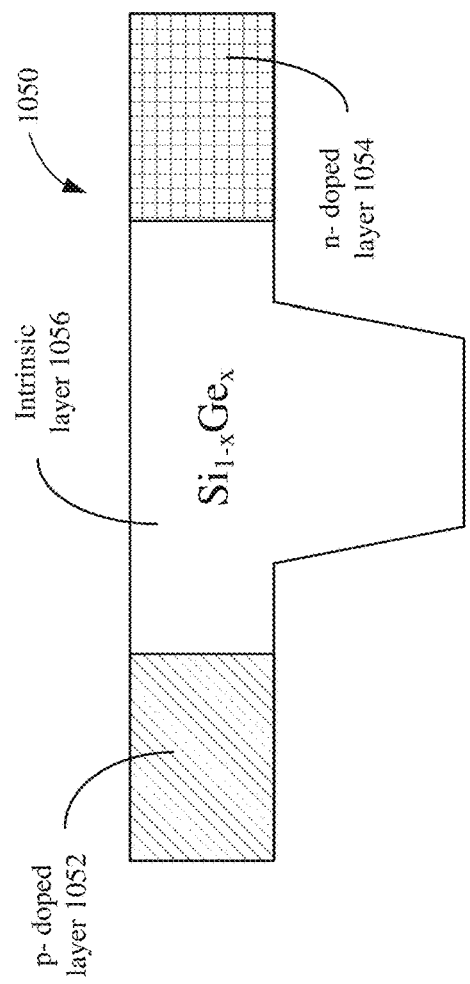

ACTIVE DEPTH SENSING IMAGE SENSOR

TECHNICAL FIELD

This disclosure relates generally to systems and methods for active depth sensing, and specifically to active depth sensing image sensors.

BACKGROUND OF RELATED ART

A device may determine distances of its surroundings using different active depth sensing systems. In determining the depth, the device may generate a depth map illustrating or otherwise indicating the depths of objects from the device by emitting one or more wireless signals and measuring reflections of the wireless signals from the scene. One type of active depth sensing system is a time-of-flight (TOF) system. For an optical TOF system (such as a Light Detection and Ranging (LIDAR) sensor), a pulsed light is emitted, and a reflection of the pulsed light is received. The round trip time of the light from the transmitter to the receiver is determined from the pulses, and the distance or depth between an object reflecting the emitted light and the TOF system is determined from the round trip time.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure relate to an image sensor. An example apparatus includes an image sensor including one or more pixels. Each pixel of the one or more pixels includes a photodetector, and the photodetector includes a photosensitive surface including germanium. In some implementations, the photodetector includes a photodiode including an intrinsic silicon layer doped with germanium or including crystalline germanium (which may be referred to as germanium crystals). The intrinsic layer may be between a p– layer and an n– layer not including germanium. The intrinsic layer may be configured to absorb photons of the light received at the intrinsic layer. The light may include one or more reflections of an emitted light for active depth sensing. For example, the emitted light may be frequency modulated and having a first wavelength for indirect time-of-flight depth sensing. Sampling circuits may generate voltages indicating a phase difference between the emitted light and a reflection of the emitted light.

In another example, a method includes receiving light at a photosensitive surface of a photodetector of a pixel of an image sensor. The photosensitive surface includes germanium. The method also includes absorbing photons of the light by the photosensitive surface and generating a current based on the absorbed photons.

In a further example, a non-transitory computer-readable medium storing instructions is disclosed. Executing the instructions by one or more processors of a device causes the device to receive light at a photosensitive surface of a photodetector of a pixel of an image sensor of the device. The photosensitive surface includes germanium. Execution of the instructions further causes the device to absorb photons of the light by the photosensitive surface and generate, by the photodetector, a current based on the absorbed photons.

In another example, an example apparatus is disclosed, the example device includes means for receiving light at a photosensitive surface of a photodetector of a pixel of an image sensor. The photosensitive surface includes germanium. The apparatus also includes means for absorbing photons of the light by the photosensitive surface and means for generating a current based on the absorbed photons.

BRIEF DESCRIPTION OF THE DRAWINGS

Aspects of the present disclosure are illustrated by way of example, and not by way of limitation, in the figures of the accompanying drawings and in which like reference numerals refer to similar elements.

FIG. 10A is a depiction of a vertical p-i-n photodiode.
FIG. 10B is a depiction of a horizontal p-i-n photodiode.

DETAILED DESCRIPTION

Figure 1:
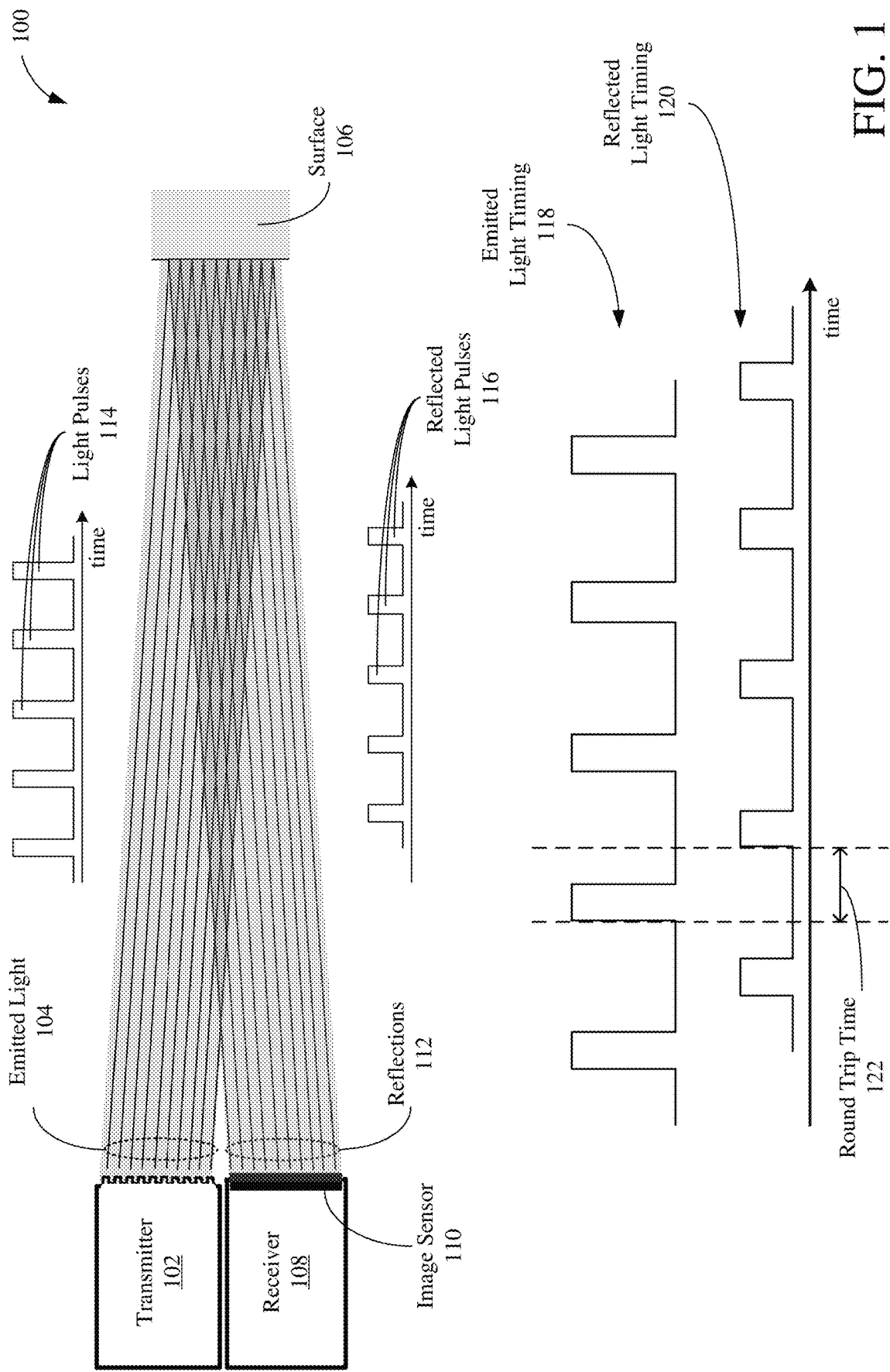
FIG. 1 is a depiction of a direct TOF system.

Aspects of the present disclosure may be used for active depth sensing systems, such as a TOF system. TOF systems are used in determining depths, and are found in many applications today, including radio detection and ranging (RADAR), sound navigation and ranging (SONAR), and light detection and ranging (LIDAR). For example, many autonomous vehicles (such as unmanned aerial vehicles (UAVs) and autonomous cars) include one or more LIDAR systems, and the LIDAR systems are used in the detection of obstacles for vehicle guidance.

An optical TOF system may emit and receive reflections of light. Many optical TOF systems, such as some LIDAR systems, may use near-infrared (NIR) light. In some implementations, NIR light may be defined as having a wavelength from 700 nanometers to 1000 nanometers. For example, a LIDAR system may use 830 nanometer or 940 nanometer wavelength light. An optical TOF system includes one or more photodetectors to receive reflections of emitted light from a transmitter of the TOF system. However, when a TOF system uses light having an 830 nanometer or 940 nanometer wavelength, reflections of the emitted light may be obscured by ambient light and interference. For example, the sun emits a majority of energy with a wavelength below 1000 nanometers (such as visible light and infrared light with a sub-1000 nanometer wavelength). As a result, reflections as received by a photodetector may be obscured in bright sunlight, and TOF systems may have difficulty in accurately determining depths.

To reduce interference caused by background radiation (such as sunlight), an optical TOF system may use a signal with a wavelength greater than 1000 nanometers (or greater than 1400 nanometers). For example, an optical TOF system may emit light having an approximate 1100 nanometer wavelength (or other wavelength with less interference from ambient light than 830 nanometers or 940 nanometers). The photosensitive surface of a photodetector, which is configured to absorb photons to provide a current, may be silicon. Silicon loses efficiency in absorbing photons as the wavelength increases above 1000 nanometers. For example, a silicon-based photosensitive surface photodiode is more efficient in absorbing 800 to 1000 nanometer wavelength light than in absorbing 1000 to 1400 (or greater) nanometer light. Indeed, a silicon-based photosensitive surface may be unable to absorb light with a wavelength greater than 1100 nanometers.

In some implementations, an image sensor may include one or more photodiodes with a different compound than pure silicon for its photosensitive surface. The compound may be configured to absorb light at least with wavelengths greater than 1000 nanometers. For example, a photodiode may have a photosensitive surface including a silicon germanium compound to increase the absorption efficiency by the photodiode of light with a wavelength greater than 1000 nanometers. In another example, the photodiode may have a photosensitive surface including germanium crystals without silicon to increase the absorption efficiency by the photodiode of light with a wavelength greater than 1400 nanometers. In this manner, an optical TOF system may use light with a wavelength greater than 1000 nanometers (or 1400 nanometers) for depth sensing.

One advantage of using higher wavelength light is that the TOF system is less impacted by ambient light and interference, which increases the signal to noise ratio of the sensed light at the photodiode and the effective range of the TOF system. Another advantage of using light with a wavelength greater than 1400 nanometers is that such light is considered safer for eyes than sub-1400 nanometer wavelength light (which may be received at the retina and damage the eye). For example, light that may be considered a retinal hazard may have a wavelength in the range of 400 nanometers (ultraviolet light) to 1400 nanometers (which may be SWIR light). Light within such range may be limited in intensity as a result of eye safety concerns. However, the intensity of emitted light with a wavelength greater than 1400 nanometers may be safely increased over the intensity of, for example, 830 nanometer wavelength light for a TOF system because the higher wavelength light would not be absorbed by a retina and cause damage. Increasing the light intensity increases the signal to noise ratio of the sensed light at the photodiode, which may increase the effective range of the TOF system and the quality of the data. Various aspects of a photodetector and image sensor for a TOF system are described herein. While the examples are provided regarding infrared light (such as greater than 1000 nanometer wavelength light, greater than 1400 nanometer wavelength light, 830 nanometer wavelength light, and 940 nanometer wavelength light), any suitable frequency spectrum signals may be used for the TOF system. The light may be in the visible light spectrum (such as visible to the naked eye) or the light may be outside the visible light spectrum (such as ultraviolet and infrared light). Additionally, any suitable infrared light may be used, including NIR, short-wave infrared (SWIR), and far-infrared (FIR). In some implementations, SWIR may refer to wavelengths between 1000 nanometers and 2500 nanometers. Infrared may also refer to light in the visible light spectrum and outside the visible light spectrum. As such, the disclosure is not limited to the provided examples of wavelengths for the emitted light.

A TOF system may be a direct TOF system or an indirect TOF system. A direct TOF system emits pulses, senses the pulses, and determines a difference in time between emitting a pulse and sensing a reflection of the pulse. The direct TOF system uses the time difference to determine a round trip time, and thus a depth of an object from the TOF system.

FIG. 1 is a depiction of an example direct TOF system 100. The direct TOF system 100 includes a transmitter 102 and a receiver 108. The transmitter 102 may also be referred to as a "projector" or an "emitter," and is not limited to a specific transmission component. The receiver 108 may be referred to as a "detector," "sensor," "sensing element," or "photodetector," and is not limited to a specific receiving component.

The transmitter 102 may be configured to emit signals (such as light 104) toward a scene including surface 106. While the emitted light 104 is illustrated as being directed to surface 106, the field of the emission by the transmitter 102 may extend beyond the size of the surface 106. For example, a TOF system transmitter may have a fixed focal length lens that defines the field of the emission for the transmitter.

The emitted light 104 includes light pulses 114 at known time intervals (such as a defined period). The receiver 108 includes an image sensor 110 to sense the reflections 112 of the emitted light 104. The reflections 112 include the reflected light pulses 116, and the TOF system determines a round trip time 122 for the light by comparing the timing 118 of the emitted light pulses 114 to the timing 120 of the reflected light pulses 116. The distance of the surface 106 from the TOF system may be calculated to be half the round trip time multiplied by the speed of the emissions (such as the speed of light for light emissions). The depth may be determined using equation (1) below:

$$D = \frac{TOF * c}{2} \quad (1)$$

where D is the depth of the surface 106 from the direct TOF system 100 and c is the speed of light (based on the transmitter 102 emitting light 104).

The image sensor 110 may include an array of photodiodes and components to sense the reflections and produce an array of currents or voltages corresponding to the intensities of the light received. Each entry in the array may be referred to as a pixel or cell. The TOF system may compare voltages (or currents) from a pixel over time to detect reflections 112 of the emitted light 104. For example, the TOF system may compare the signal to a threshold (corresponding to noise, such as ambient light), and the TOF system may identify peaks greater than the threshold as reflected light pulses 116 sensed by the image sensor 110. The threshold may be based on ambient light or other interference. For example, an amount of ambient light may exist (without the emitted light 104), and the threshold may be based on the magnitude of ambient light (such as measured by the image sensor 110). The upper limit of the effective range of a TOF system may be the distance where the noise or the degradation of the signal before sensing the reflections cause the signal-to-noise ratio (SNR) to be too great for the sensor to accurately sense the reflected light pulses 116. To reduce interference (and thus increase range or improve the signal to noise ratio), the receiver 108 may include a bandpass filter before the image sensor 110 to filter incoming light outside of a wavelength range than the emitted light 104.

Direct TOF systems may be susceptible to interference, such as ambient light or other noise that may obscure pulses in the reflections received at the image sensor 110. As a result, each pixel of an image sensor 110 of a direct TOF system may include a single-photon avalanche diode (SPAD) due to its sensitivity and responsivity to enable identifying pulses in the reflections and resolving the arrival time of pulsed light reflections. However, SPAD-based depth sensing suffers from a trade-off between spatial resolution and background light rejection capability. Increasing spatial resolution decreases the ability to differentiate pulses from ambient light. In addition, the area required for readout circuits of the SPADs, time-correlated time-to-digital converters (TDCs) and memory cells of the image sensor 110 reduces available space for other components of the direct TOF system or other systems.

Another TOF system is an indirect TOF system (which may also be referred to as a Frequency Modulated Continuous Wave (FMCW) TOF system). An indirect TOF system emits a periodic signal (such as a continuous wave sinusoidal signal or periodic pulsed light), senses a reflection of the signal, and determines a phase difference between the emitted signal and the sensed reflection of the signal. The indirect TOF system uses the phase difference to determine a depth of an object from the TOF system.

Figure 2:
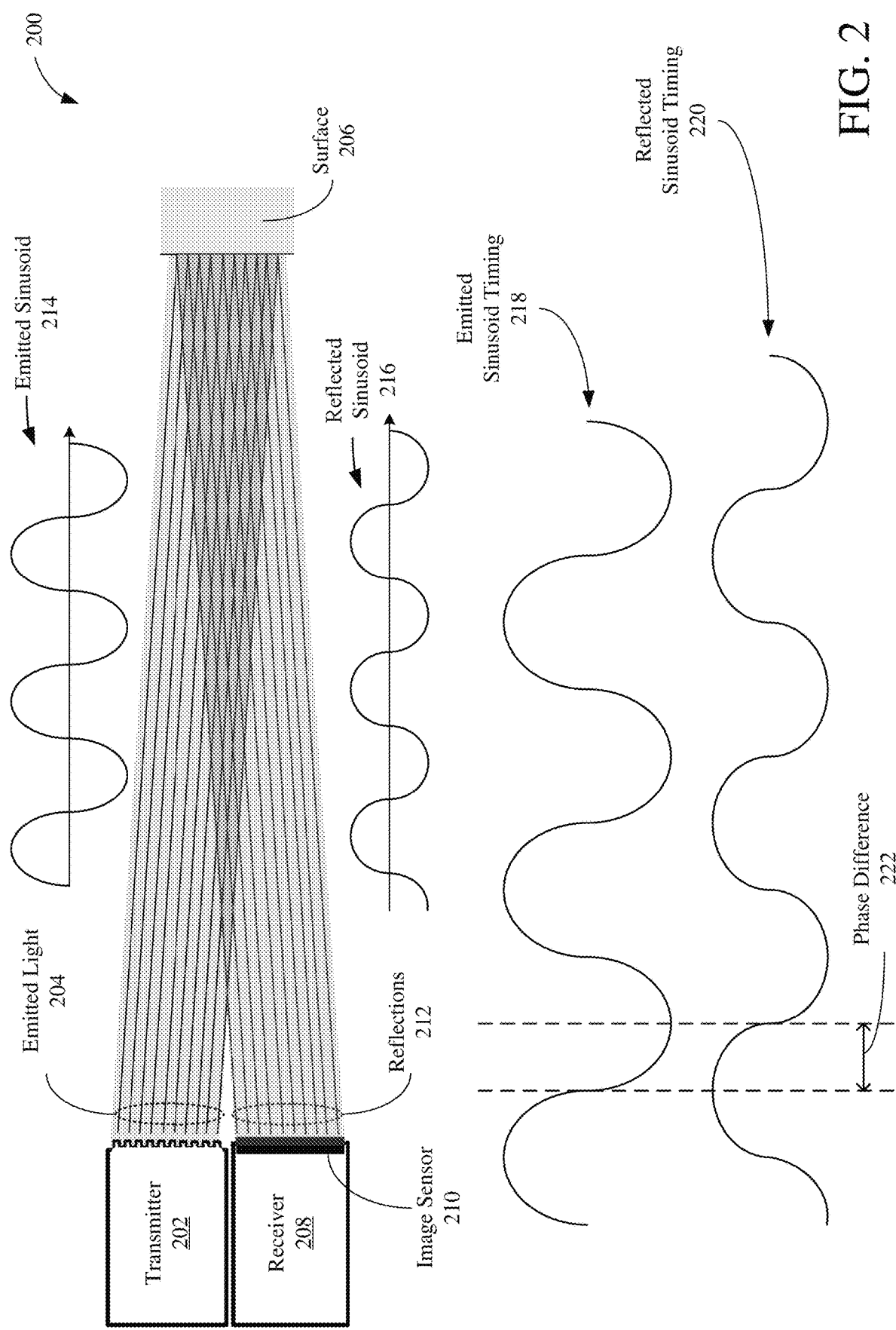
FIG. 2 is a depiction of an indirect TOF system.

FIG. 2 is a depiction of an example indirect TOF system 200. The indirect TOF system 200 includes a transmitter 202 and a receiver 208. The transmitter 202 may be configured to emit signals (such as light 204) toward a scene including surface 206. While the emitted light 204 is illustrated as being directed to surface 206, the field of the emission by the transmitter 202 may extend beyond the size of the surface 206. For example, a TOF system transmitter may have a fixed focal length lens that defines the field of the emission for the transmitter.

The emitted light 204 includes a sinusoidal signal 214 (or other suitable periodic signal) of a defined frequency. The receiver 208 includes an image sensor 210 to sense the reflections 212 of the emitted light 204. The reflections 212 include the reflected sinusoidal signal 216. The indirect TOF system 200 determines a phase difference 222 between the emitted sinusoidal signal 214 and the reflected sinusoidal signal 216 (as illustrated by emitted sinusoid timing 218 and reflected sinusoid timing 220). The phase difference 222 may indicate a round trip time and thus may be used to determine the distance of the surface 206 from the indirect TOF system. To produce the sinusoidal signal 214, the TOF system 200 may be configured to modulate a carrier signal to produce the sinusoid wave. For example, a 940 nanometer wavelength light may be modulated to create the sinusoidal signal 214. The frequency of the wave may be referred to herein as a modulation frequency. In comparing the relationship of TOF and phase difference, the TOF may be defined in terms of the measured phase difference (PD) and the modulation frequency ($f_{mod}$), as depicted in equation (2) below:

$$TOF = \frac{PD}{2\pi f_{mod}} \quad (2)$$

In a simplified example, if the PD is $\pi$ and $f_{mod}$ is approximately 250 kilohertz (kHz), the TOF is 2 microseconds (1 divided by 500 kHz). Referring back to equation (1), the depth D based on the TOF equaling 2 microseconds is approximately 300 meters.

While FIG. 2 illustrates the emitted signal as having a sinusoidal waveform, any suitable waveform may be used. For example, the TOF system may be configured to stepwise increase and decrease the intensity of the emitted light in a periodic pattern. In this manner, the waveform of the emitted light may approximate a square wave (such as for a periodic pulsed signal). Other waveforms may be used, including a saw waveform and so on. As used herein, a sinusoid waveform or wave may refer to any suitable waveform for the signals (including an approximated square wave).

Figure 3:
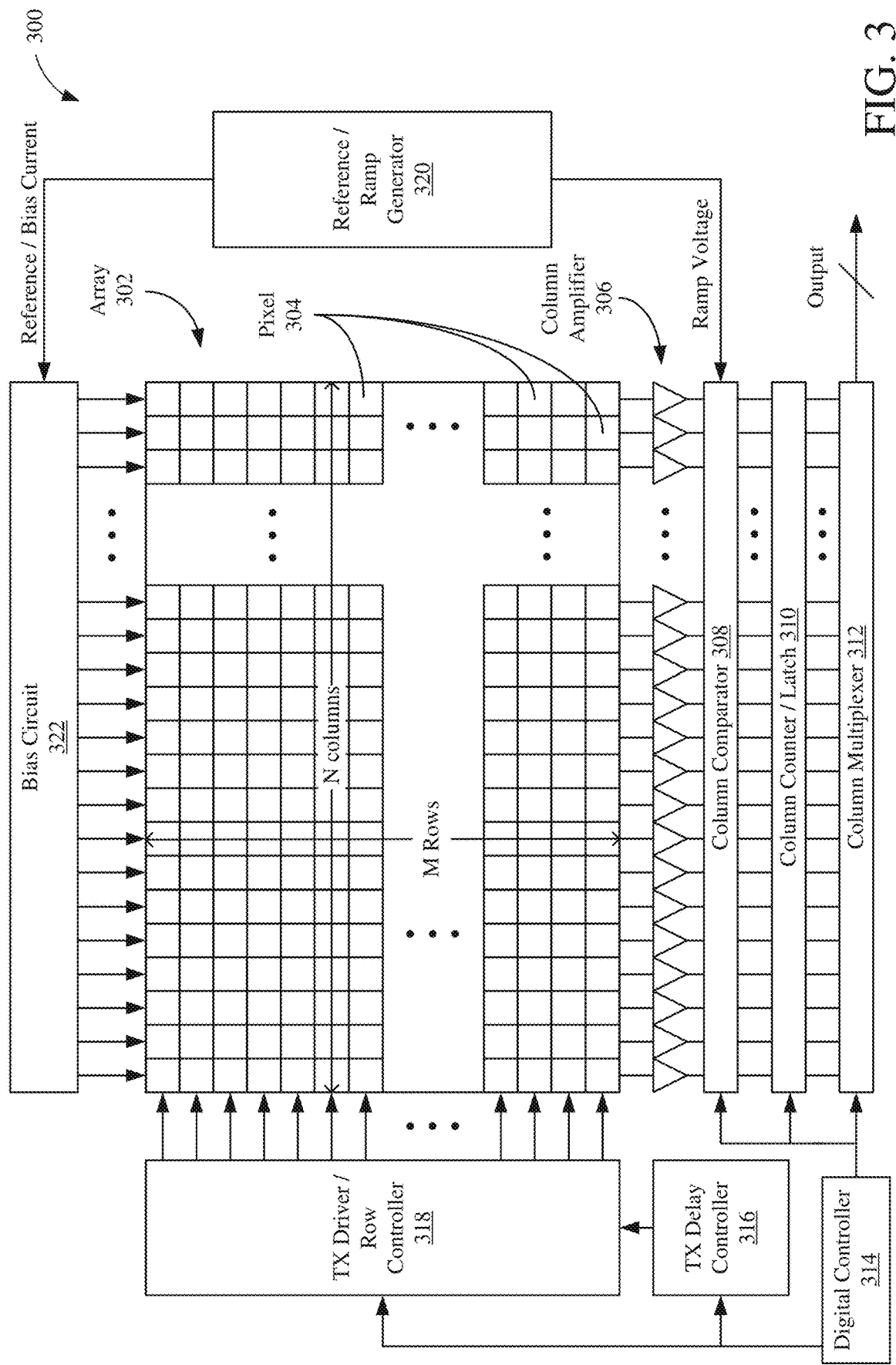
FIG. 3 is a depiction of an image sensor of an indirect TOF system.
Figure 4:
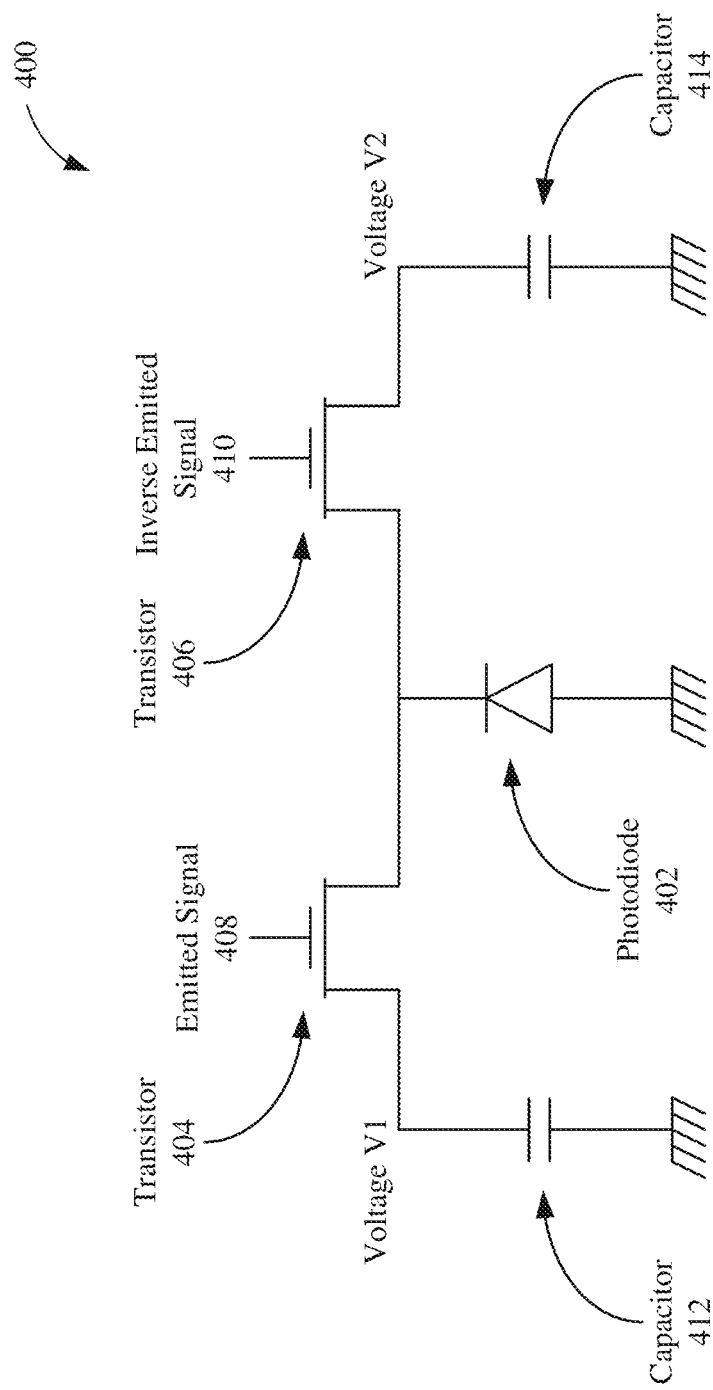
FIG. 4 is a depiction of a demodulation pixel.

In some implementations, the indirect TOF system 200 may include a demodulation circuit for each pixel of the image sensor 210 (referred to herein as a demodulation pixel or a lock-in pixel). Each demodulation pixel may include a demodulation photodetector and be configured to generate and store one or more voltages corresponding to a phase or phase difference of the reflected sinusoidal signal received at the photodiode of the array and the emitted sinusoidal signal. The phase difference may be determined from the one or more stored voltages. For example, a demodulation pixel may generate a voltage signal (such as using a current from a photodiode to determine whether to send a pixel voltage (such as a rail voltage) or a low voltage as the voltage signal). An example image sensor 210, using the demodulation pixels, may generate an array of voltages for a single capture by the image sensor 210. The array of voltages may be processed to generate a PD for each pixel. FIG. 3 illustrates an example indirect TOF image sensor, and FIG. 4 illustrates a demodulation pixel of an example image sensor.

FIG. 3 is a depiction of an indirect TOF image sensor 300. The image sensor 300 may be an example implementation of the image sensor 210 in FIG. 2. The image sensor 300 includes an array 302 of pixels 304, column amplifiers 306, a column comparator 308, a column counter 310, a column multiplexer (MUX) 312, a digital controller 314, a transmit (TX) delay controller 316, a TX driver/row controller 318, a reference signal/ramp generator 320, and a bias circuit 322. The array 302 may be of size M rows by N columns of pixels 304. In some implementations, the array 302 may be 512×512 pixels in size. Each pixel 304 may include a demodulation pixel. The pixels 304 may be arranged such that the array includes a 5 micrometer×5 micrometer pitch. In some other implementations, the pitch may be 7.5 micrometers×7.5 micrometers (such as for a 256×256 pixel array 302).

The image sensor 300 may be configured to drive pixel rows of the array for absorbing photons and generating a voltage corresponding to the photons absorbed. For example, the TX driver/row controller 318 may receive a signal from a digital controller 314, and provide a signal to one or more of the rows of the array 302 to drive those pixels 304 for readout from the array 302. The driven pixels 304 may provide the stored voltages to the column amplifiers 306, which amplify the received signals from the driven row of pixels 304. The amplified signals are provided to the column comparator 308, the column counter/latch 310 and the column MUX 312 for processing before being output by the image sensor 300. The digital controller 314 may be configured to control operation of the comparator 308, counters 310 and MUX 312.

The column comparator 308 may be configured to compare the amplified signals from the pixels 304 to a threshold voltage to determine a value for the voltage from the pixel 304. For example, the reference/ramp generator 320 may provide a ramp voltage to the comparator 308 for each readout from the array 302. If the ramp voltage is ascending, the comparator may compare the received voltage from the pixel 304 to the ramp voltage until the ramp voltage is greater than the voltage from the pixel 304. In this manner, the comparator 308 may convert the voltage from the pixel 304 to a value corresponding to the ramp voltage when the two voltage levels cross each other. The values may be provided to the counter 310 to add the values over multiple readouts, and the added value may be provided to the MUX 312 at a determined time. The MUX 312 may then combine the values for output from the image sensor 300, and the output may be used by the TOF system (such as a signal processor or controller)to determine a depth of an object from a corresponding pixel 304 of the image sensor 300.

The TOF emitter may have a delay in emitting the modulated light. The image sensor 300 may be configured to delay driving the rows of the array 304 to compensate for the delay. For example, the digital controller 314 may control the TX delay controller 316 to delay the TX driver/row controller 318 from driving one or more rows of the array 302 for amount of time corresponding to the delay.

The intensity of the emitted light decreases as it travels through the scene and is reflected by one or more objects. As a result, the intensity of the reflected light received at the image sensor 300 is less than the intensity of the emitted light at the transmitter of the TOF system. To compensate, the image sensor 300 may combine a bias voltage with the voltages from the pixels 304. For example, the reference/ramp generator 320 may provide a reference signal (such as a bias current) to the bias circuit 322, and the bias circuit 322 may convert the reference signal to a bias voltage applied to the columns of the array 302.

As noted above, each pixel 302 may be a demodulation pixel. A demodulation pixel may sample multiple times per wavelength to prevent ambiguity in determining the phase of the reflected signal (since a value may occur two times within a $\pi$ wavelength of a sinusoid wave). For example, a 2-phase demodulation pixel may sample two times every wavelength (such as at 0 and $\pi$), a 3-phase demodulation pixel may sample three times every wavelength (such as at 0, 2/3 $\pi$, and 4/3 $\pi$), and a 4-phase demodulation pixel may sample four times every wavelength (such as at 0, 1/2 $\pi$, $\pi$, and 3/2 $\pi$).

FIG. 4 is a depiction of a demodulation pixel 400 of an indirect TOF system. The demodulation pixel 400 is an example of a 2-phase demodulation pixel. The demodulation pixel 400 may be an implementation of a demodulation pixel of the image sensor 300 in FIG. 3. The demodulation pixel 400 may be illustrated in a simplified form to explain aspects of the pixel. For example, while not shown, the demodulation pixel 300 may include one or more read out lines, filtering components, voltage rails, reset switches, and other components.

The demodulation pixel 400 includes a photodiode 402, a first transistor 404, a second transistor 406, a first capacitor 412, and a second capacitor 414. The photodiode 402 is configured to convert received light (including the reflected light from the emitter and ambient light) to a current. If the pixel 400 samples during the first half of a phase of the reflected signal (such as when the reflected sinusoidal signal has a phase of 1/2 $\pi$), the current may be higher that if sampled during the second half of the phase.

The first transistor 404 is configured to receive the current from the photodiode 402 and output a voltage V1 to be stored in capacitor 412 based on the current. In some implementations, the voltage V1 may be a voltage from a voltage rail (not shown) of the demodulation pixel 400 when the current from the photodiode 302 is high and the first transistor 404 is closed. Operation of the first transistor 404 is controlled by a representation of the emitted signal 408. In this manner, the transistor 404 may enable the capacitor 412 when the phase of the emitted signal 408 is between 0 and $\pi$, and the transistor 404 may disable the capacitor 412 when the phase of the emitted signal 408 is between $\pi$ and 2$\pi$. As used herein for a demodulation pixel, the emitted signal may be a voltage signal with a frequency corresponding to the modulation frequency of the emitted light.

The second transistor 406 is configured to receive the current from the photodiode 402 and output a voltage V2 to be stored in capacitor 414. In some implementations, the voltage V2 may be a voltage from a voltage rail (not shown) of the demodulation pixel 400 when the current from the photodiode 302 is high and the second transistor 406 is closed. Operation of the second transistor 406 is controlled by a representation of the inverted emitted signal 410 (such as the emitted signal 408 shifted by $\pi$). In this manner, the transistor 406 may disable the capacitor 414 when the phase of the inverted emitted signal 410 is between 0 and $\pi$, and the transistor 406 may enable the capacitor 414 when the phase of the inverted emitted signal 410 is between $\pi$ and 2$\pi$. Voltages V1 and V2 can be read out and compared to determine the phase difference between the reflected signal and the emitted signal. For example, if V1 switches from low to high when the emitted signal 408 is high, the phase difference may be between 0 and $\pi$. If V2 switches from low to high when the inverse emitted signal 410 is high, the phase difference may be between $\pi$ and 2$\pi$. The demodulation pixel 400 may include additional transistor and capacitor pairs (not shown) to increase the number of phases for sampling. For an example 3-phase demodulation pixel, one additional transistor and capacitor pair may be coupled to the photodiode 402 (similar to the transistors 404 and 406), and the transistors may be controlled by the emitted signal with different phase offsets (such as the emitted signal 408, 2/3 $\pi$ phase offset from the emitted signal 408, and 4/3 $\pi$ phase offset from the emitted signal 408). For an example 4-phase demodulation pixel, two additional transistor and capacitor pairs may be coupled to the photodiode 402 (similar to the transistors 404 and 406), and the transistors may be controlled by the emitted signal with different phase offsets (such as the emitted signal 408, 1/2 $\pi$ phase offset from the emitted signal 408, $\pi$ phase offset from the emitted signal 408, and 3/2 $\pi$ phase offset from the emitted signal 408). An implementation of a 2-phase demodulation pixel is illustrated in FIG. 5, an implementation of a 3-phase demodulation pixel is illustrated in FIG. 6, and an implementation of a 4-phase demodulation pixel is illustrated in FIG. 7.

Figure 5:
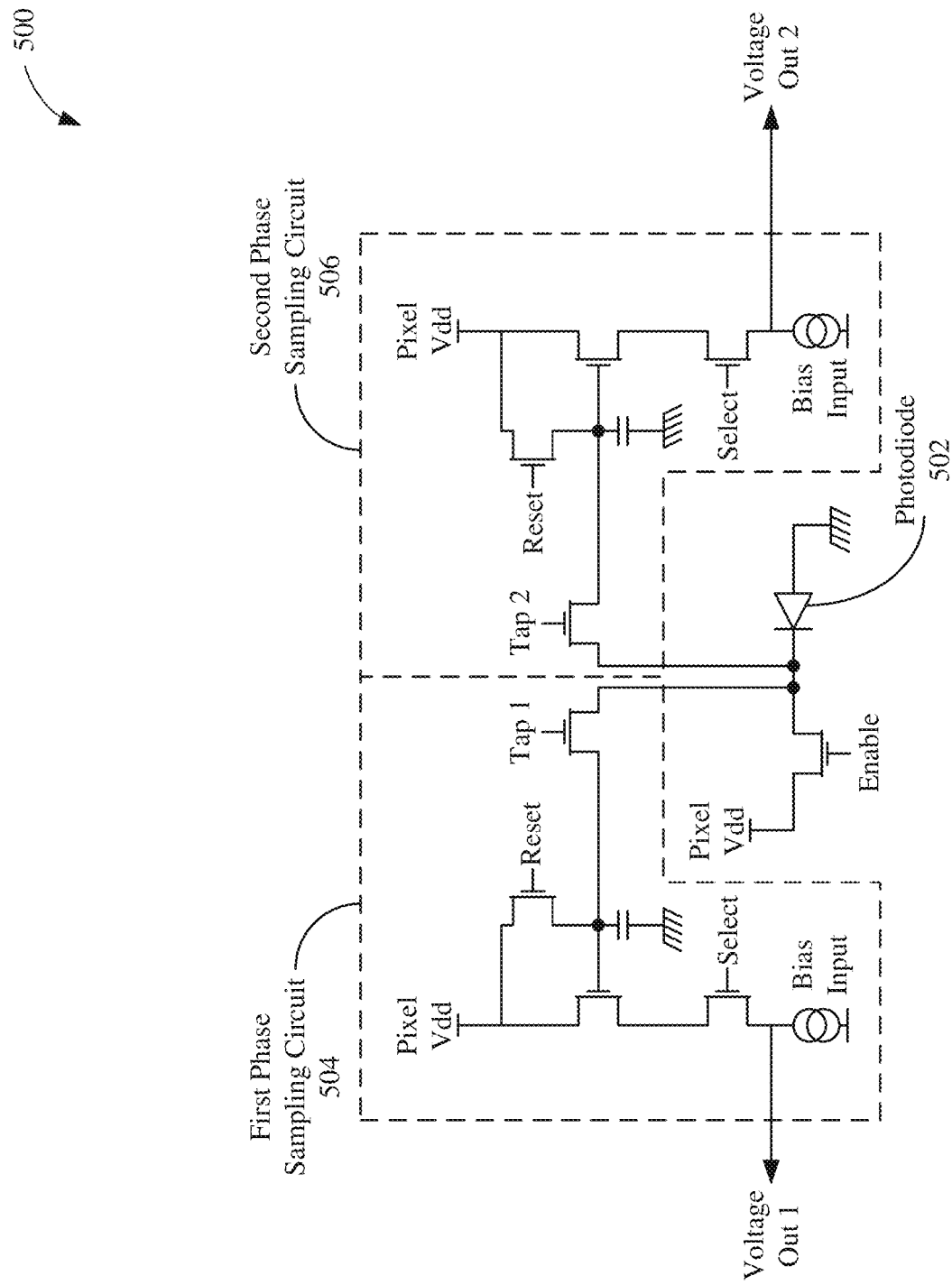
FIG. 5 is a depiction of a 2-phase demodulation pixel.

FIG. 5 is a depiction of an implementation of a 2-phase demodulation pixel 500. The demodulation pixel 500 may be an implementation of the demodulation pixel 400 in FIG. 4. The demodulation pixel 500 includes a photodiode 502, a first phase sampling circuit 504, and a second phase sampling circuit 506. In some implementations, the first phase sampling circuit 504 may have the same configuration as the second phase sampling circuit 506. The difference between the first phase sampling circuit 504 and the second phase sampling circuit 506 may be Tap 1 receiving an emitted signal with a first phase offset (such as 0 phase offset) to enable the circuit 504 and Tap 2 receiving an emitted signal with a second phase offset (such as $\pi$ phase offset) to enable the circuit 506. In some implementations, higher phase demodulation pixels (such as a 3-phase demodulation pixel or a 4-phase demodulation pixel) may include additional sampling circuits.

Figure 6:
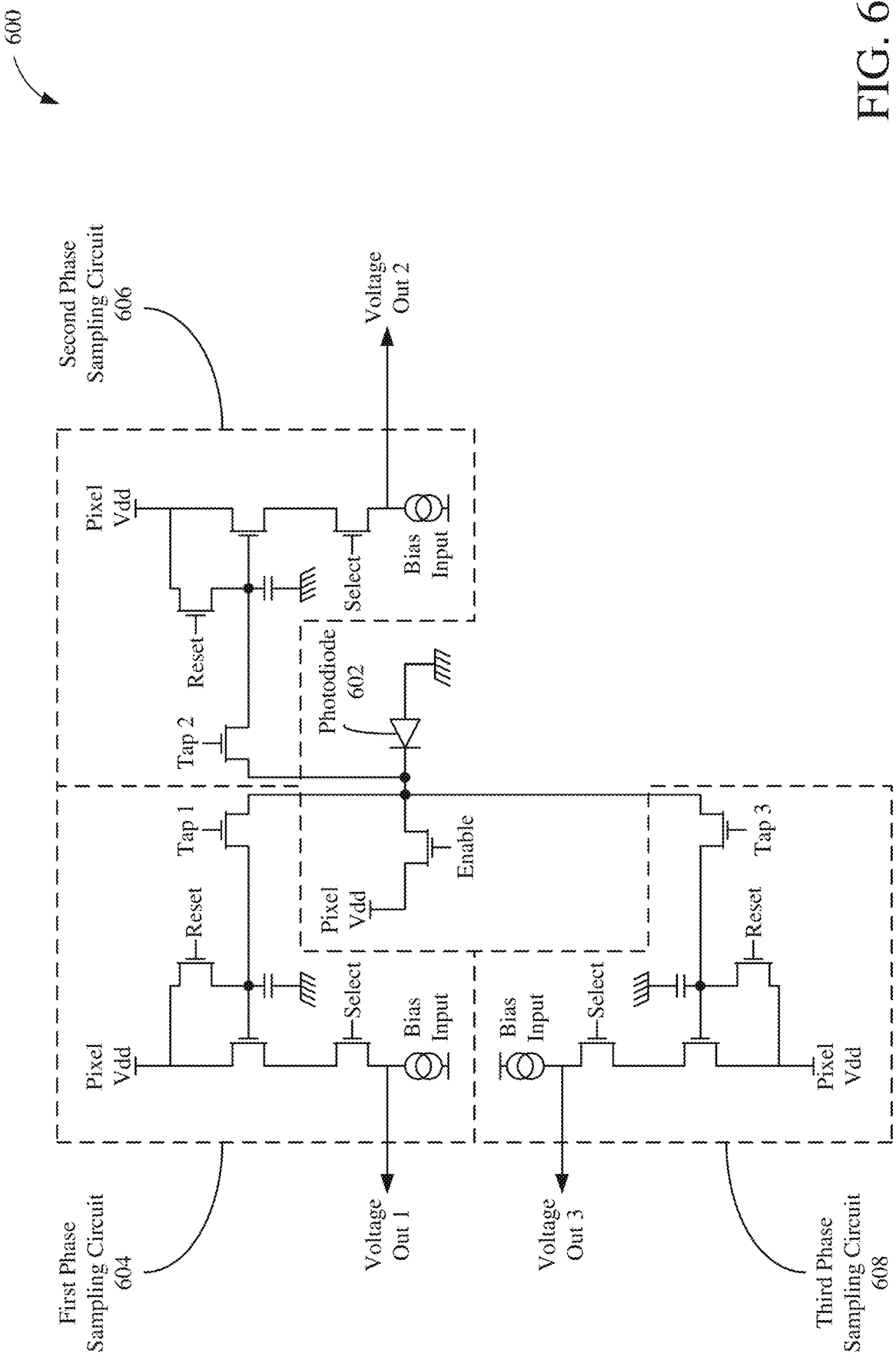
FIG. 6 is a depiction of a 3-phase demodulation pixel.

FIG. 6 is a depiction of an implementation of a 3-phase demodulation pixel 600. The 3-phase demodulation pixel 600 includes a photodiode 602, a first sampling circuit 604, a second sampling circuit 606, and a third sampling circuit 608. The 3-phase demodulation pixel 600 may be similar to the 2-phase demodulation pixel 500 in FIG. 5, except that the 3-phase demodulation pixel 600 includes an additional sampling circuit 608. The third sampling circuit 608 may be enabled based on the tap 3 receiving the emitted signal with the third phase offset. In this manner, sampling by the three sampling circuits 604, 606, and 608 may be performed for different phase offsets of the emitted signal.

Figure 7:
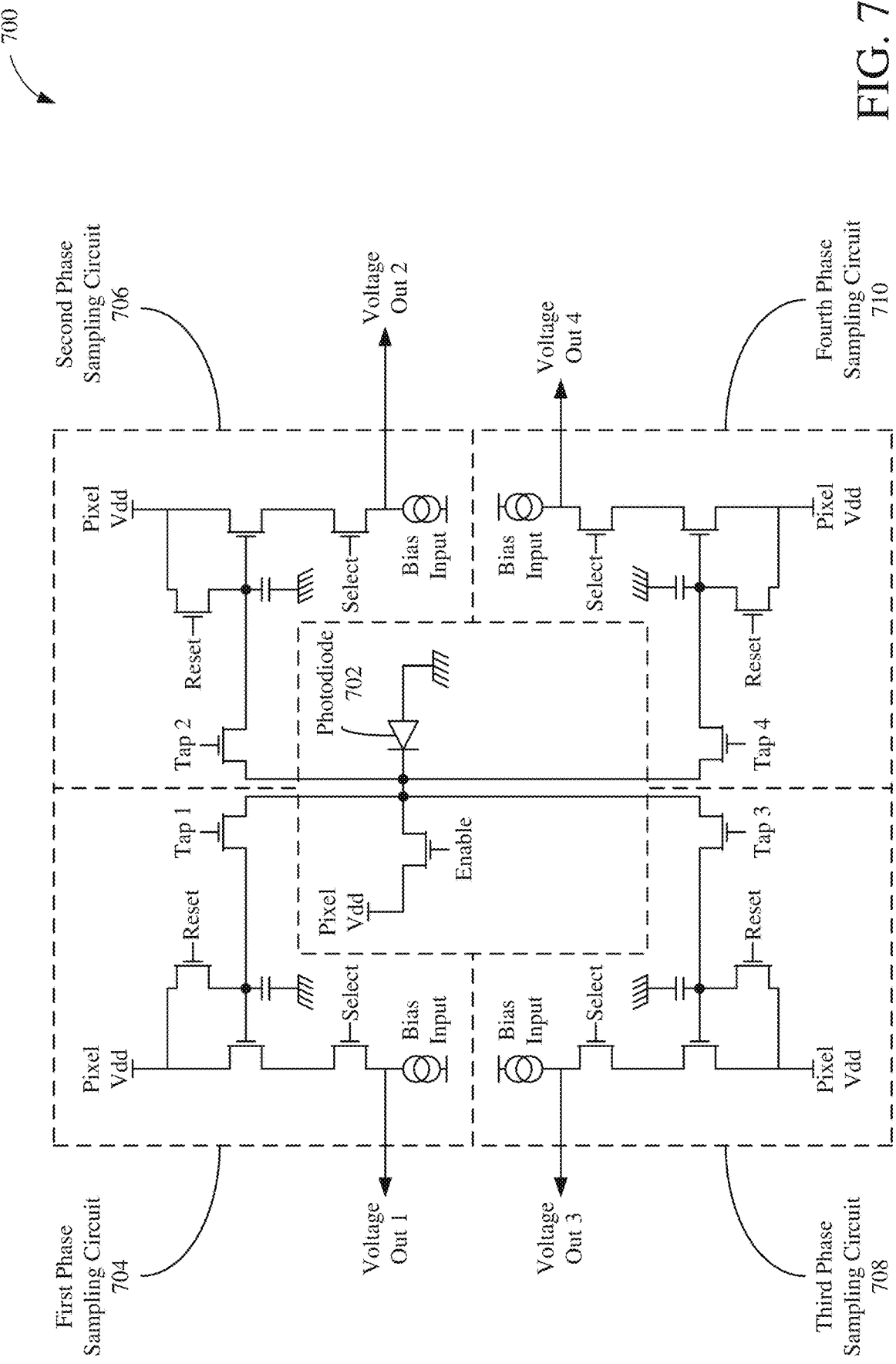
FIG. 7 is a depiction of a 4-phase demodulation pixel.

FIG. 7 is a depiction of an implementation of a 4-phase demodulation pixel 700. The 4-phase demodulation pixel 700 includes a photodiode 702, a first sampling circuit 704, a second sampling circuit 706, a third sampling circuit 708, and a fourth sampling circuit 710. The 4-phase demodulation pixel 700 may be similar to the 3-phase demodulation pixel 600 in FIG. 6, except that the 4-phase demodulation pixel 700 includes an additional sampling circuit 710. The fourth sampling circuit 710 may be enabled based on the tap 4 receiving the emitted signal with the fourth phase offset. In this manner, sampling by the four sampling circuits 704, 706, 708, and 710 may be performed for different phase offsets of the emitted signal (such as 0, $1/2\, 7\pi$, $\pi$, and $3/2\, \pi$). While evenly spaced phase offsets are described in some of the examples, any suitable phase offsets (and spacing of such phase offsets) may be used.

Each of the photodiodes 502, 602, and 702 in FIGS. 5-7, respectively, are coupled to the corresponding sampling circuits of the demodulation pixel. A photodiode of a demodulation pixel may provide, to each of the sampling circuits, a current corresponding to the photons received at a photosensitive surface of the photodiode. As noted above, a photodetector (such as a photodiode) having a pure silicon photosensitive surface may inefficiently absorb photons to generate a current when the wavelength of the light received at the photosensitive surface is greater than 1000 nanometers. In some implementations, a photodetector may include a photosensitive surface including a non-silicon element to improve the absorption of light having a wavelength greater than 1000 nanometers. For example, a p-i-n photodiode may include a photosensitive intrinsic layer that is not purely silicon. In some implementations, the photosensitive surface may include germanium. For example, the intrinsic layer of a p-i-n photodiode may include a combination of silicon and germanium. In some other implementations, the photosensitive surface may be crystalline germanium. For example, if the wavelength of the emitted light to be received is greater than 1400 nanometers, the intrinsic layer of a photodiode may be crystalline germanium without silicon or other elements.

Figure 8:
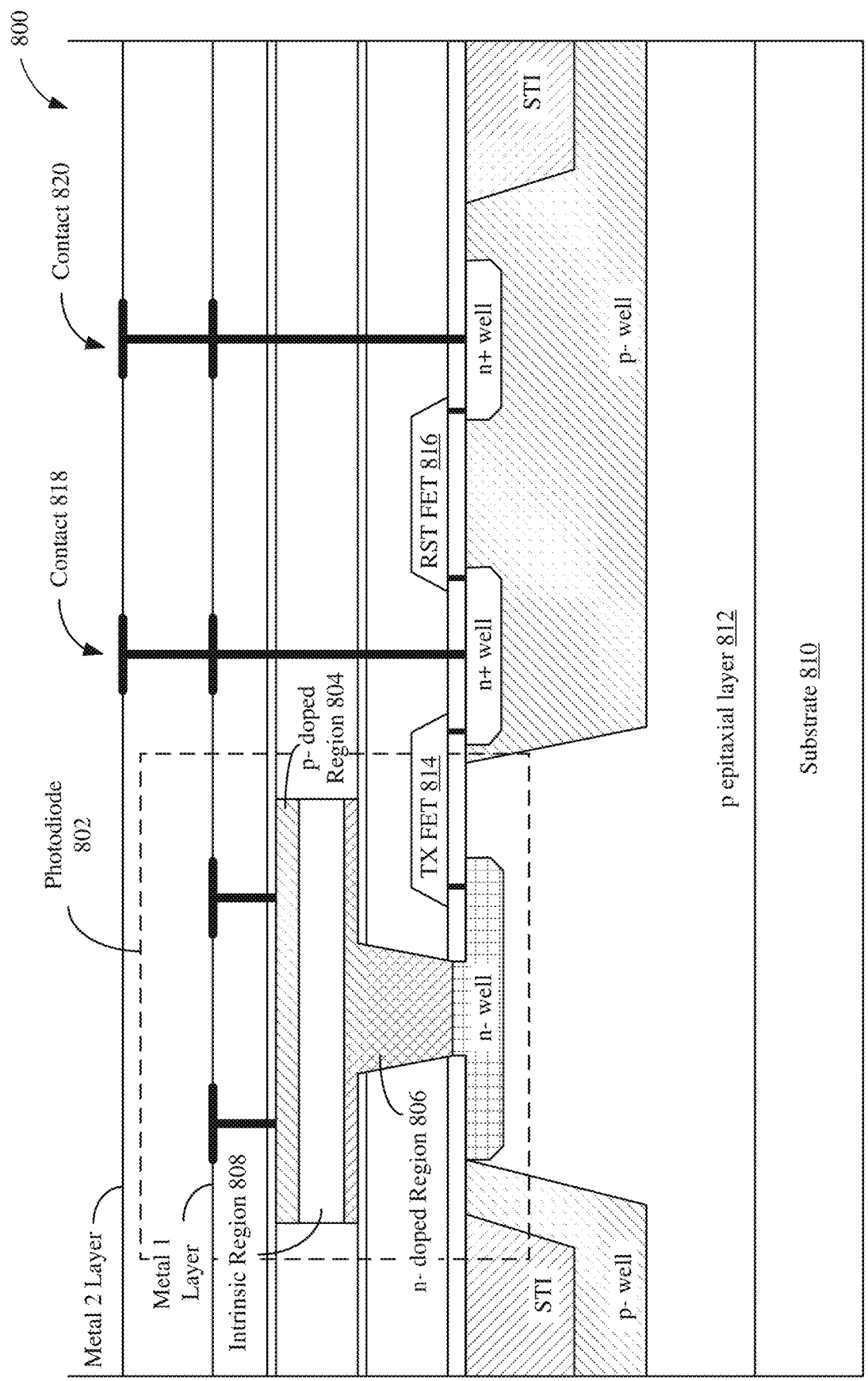
FIG. 8 is a depiction of a portion of a circuit including a photodiode configured to be coupled to one or more sampling circuits.

FIG. 8 is a depiction of a portion of a circuit 800 including a photodiode 802 configured to be coupled to one or more sampling circuits. As depicted, the photodiode 802 is a vertical p-i-n photodiode including a p– doped region 804, an n-doped region 806, and an intrinsic region 808 between regions 804 and 806. In some implementations, two contacts from a metal 1 (M1) layer may be coupled to the photodiode 802 to control operation.

For a p-i-n photodiode 802, the intrinsic layer 808 may be exposed to incoming light (at the demodulation pixel), and the intrinsic layer 808 may be configured to absorb the received photons to cause the photodiode 802 to generate a current to the n– well in a p epitaxial layer 812 on a substrate 810 of a silicon chip. When the transmit (TX) field effect transistor (FET) 814 is enabled, the current from the photodiode 802 may be provided to contact 818 via an n+ well. The n+ well may store a floating charge from the photodiode 802 when the contact 818 is open. Contact 818 may be coupled to the one or more sampling circuits (such as depicted in FIGS. 5-7), and the current from the photodiode 802 may be provided to the sampling circuit when the sampling circuit is enabled.

The circuit 800 may also include a contact 820 for resetting the charge from the photodiode 802. The reset signal may enable the reset (RST) FET 816 to drain the floating charge from the n+ well coupled to the contact 818 to the other n+ well. As shown, the n+ wells may be included in a p– well. To isolate the portion of the silicon chip corresponding to the photodiode 802 from other components (such as to prevent parasitic interference or leaching), the p– wells may include shallow trench insulators (STIs). As illustrated, one or more contacts (such as contacts 818 and 820, or the contacts coupled to the photodiode 802) may be coupled to one or more metal layers of the circuit (such as the M1 layer and/or the metal 2 (M2) layer).

As noted, FIG. 8 depicts a vertical p-i-n photodiode 802 where the layers are stacked vertically. In some other implementations, a photodiode may be a horizontal p-i-n photodiode. For a horizontal p-i-n photodiode, the layers are stacked horizontally.

Figure 9:
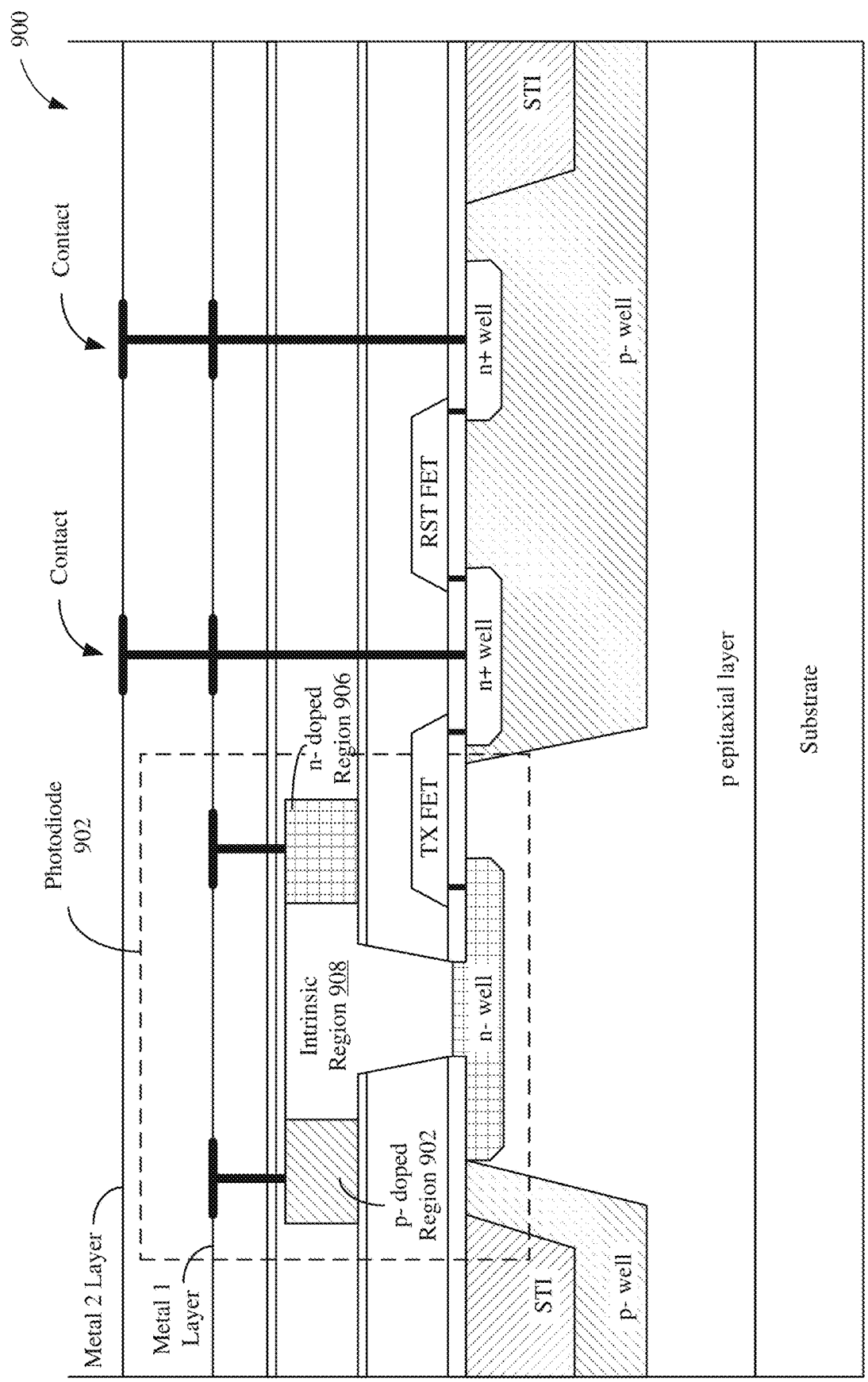
FIG. 9 is a depiction of a portion of a circuit including a horizontal p-i-n photodiode configured to be coupled to one or more sampling circuits.

FIG. 9 is a depiction of a portion of a circuit 900 including a horizontal p-i-n photodiode 902 configured to be coupled to one or more sampling circuits. As shown, the circuit and silicon chip configuration may be the same for the photodiode 902 and the photodiode 802 in FIG. 8. The photodiode 902 includes a p– doped region 904, an intrinsic region 908, and an n– doped 906 stacked horizontally. The intrinsic layer 908 is exposed to the light received at the demodulation pixel, and the intrinsic layer 908 is configured to absorb the received photons to cause the photodiode 902 to provide a current to the n– well.

To increase absorption at the intrinsic region 808 (in FIGS. 8) and 908 for higher wavelength light than 830 nanometers or 940 nanometers (such as greater than 1000 nanometer wavelength light), the material of the intrinsic layer may include an element in addition to, or alternative to, silicon. For example, the material may be a silicon germanium compound. In some implementations, during manufacture of the photodiode, the intrinsic region may be silicon that is doped with germanium. In another example, the material may be a crystalline germanium.

FIG. 10A is a depiction of a vertical p-i-n photodiode 1000. The vertical p-i-n photodiode 1000 may be an implementation of photodiode 800 in FIG. 8. The photodiode 1000 includes a p– layer 1002, an n– layer 1004, and an intrinsic layer 1006 stacked vertically. The intrinsic layer 1006 includes silicon doped with germanium or an exclusively germanium material (as indicated by the depicted atomic structure $Si_{1-x}Ge_x$ where x is greater than 0 and x is less than or equal to 1). In some implementations, the p– layer 1002 and the n– layer 1004 are not doped with germanium or otherwise include germanium. In this manner, the germanium intrinsic layer 1006 may be between silicon layers without germanium. FIG. 10B is a depiction of a horizontal p-i-n photodiode 1050. The photodiode 1050 includes a p– layer 1052, an p– layer 1054, and an intrinsic layer 1056 stacked horizontally. The horizontal p-i-n photodiode 1050 may be an implementation of photodiode 900 in FIG. 9. The intrinsic layer 1056 includes silicon doped with germanium or an exclusively germanium material (as indicated by the depicted atomic structure $Si_{1-x}Ge_x$ where x is greater than 0 and x is less than or equal to 1). In some implementations, the p− layer 1052 and the n− layer 1054 are not doped with germanium or otherwise include germanium. In this manner, the germanium intrinsic layer 1056 may be between silicon layers without germanium. For germanium doped silicon, the amount of germanium doped into the silicon may be any suitable amount such that the ratio of silicon atoms to germanium atoms may be any suitable ratio. In some other implementations, the intrinsic layer may be a material excluding silicon (such as germanium or germanium doped with another element). Through the introduction of another element (such as germanium), the photodiode is able to more efficiently absorb photons from light with a wavelength greater than 1000 nanometers (such as a wavelength of 1000 to 1400 nanometers for germanium doped silicon in the photodiode or a wavelength of greater than 1400 nanometers for crystalline germanium in the photodiode).

An image sensor may include, for one or more pixels, a photodetector having a photosensitive surface including germanium. For example, each demodulation pixel of an image sensor array may include a photodiode, and the photodiode may include an intrinsic layer of silicon doped with germanium (or pure germanium without silicon). While the examples are described regarding a germanium doped silicon photosensitive region, the examples also apply to other materials, including germanium crystals (as described herein).

The image sensor may be included in a receiver for active depth sensing. For example, the image sensor may be included in a receiver of a TOF system (such as an indirect TOF system) for determining a depth of one or more objects' surfaces from the TOF system. The demodulation pixel may be any suitable configuration to determine a phase difference between light emitted by an indirect TOF system's emitter and reflections of the light received at the indirect TOF system's receiver. For example, the demodulation circuit may be a 2-phase demodulation circuit, a 3-phase demodulation circuit, a 4-phase demodulation circuit, or another suitable phase demodulation circuit. The demodulation circuit may include filtering or processing components (such as for background light cancellation or reduction, wave drift compensation, and so on).

The active depth sensing system (such as an indirect TOF system) including the image sensor may be included in any suitable device. For example, the image sensor including one or more demodulation pixels having a germanium doped intrinsic layer photodiode may be included in a LIDAR system coupled to a vehicle (such as a car or UAV) for autonomous operation of the vehicle. In another example, the image sensor may be included in a wireless communication device (such as a smartphone, tablet, and so on). In a further example, the image sensor may be included in a handheld device (such as a digital camera, a range finder, and so on). The image sensor may be included in any suitable device for active depth sensing.

Figure 11:
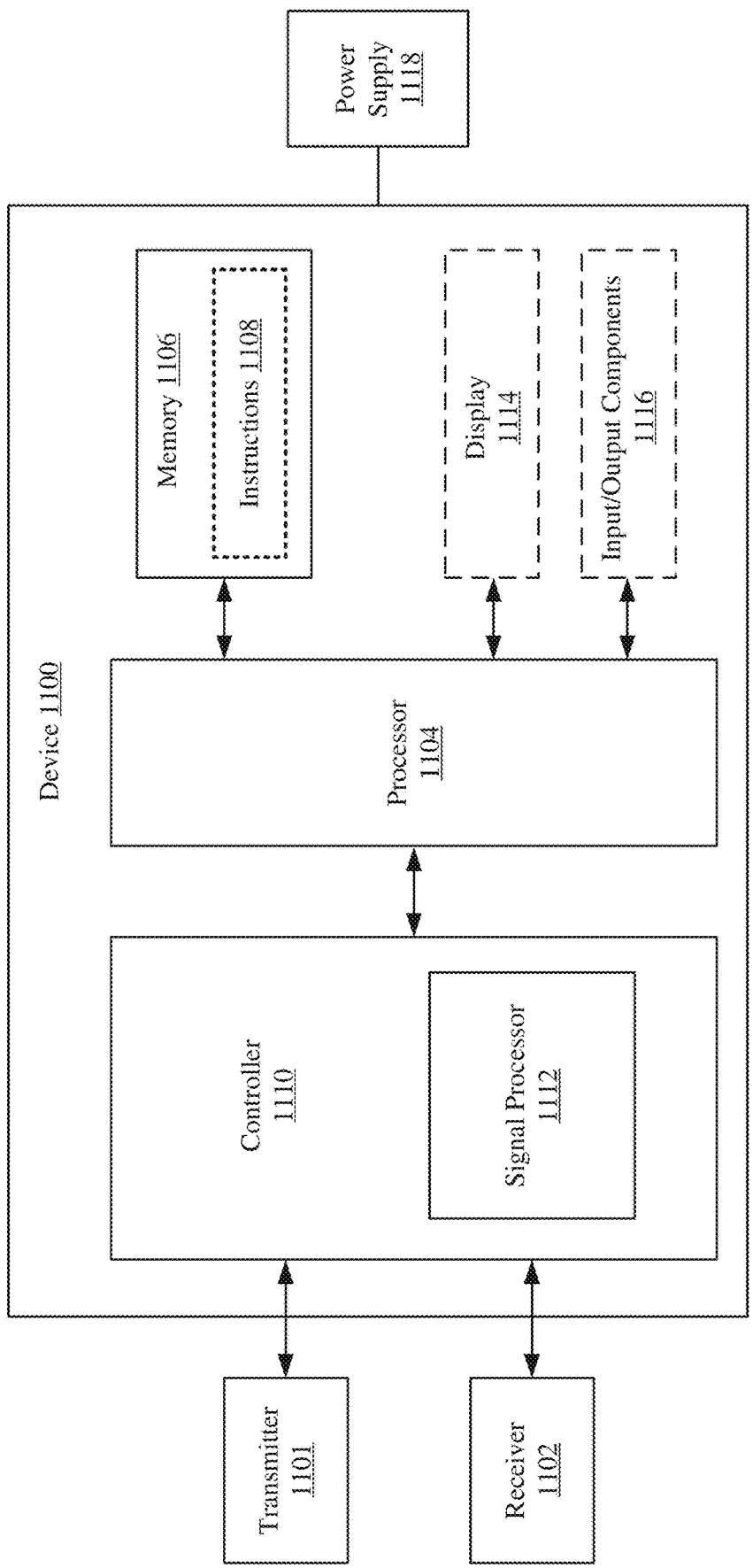
FIG. 11 is a block diagram of an example device including a TOF system.

FIG. 11 is a block diagram of an example device 1100. The example device 1100 may include an active depth sensing system. In some other examples, the active depth sensing system may be coupled to the device 1100. The example device 1100 may include a transmitter 1101, a receiver 1102, a processor 1104, a memory 1106 storing instructions 1108, and a controller 1110 (which may include one or more signal processors 1112). The device 1100 may optionally include (or be coupled to) a display 1114 and a number of input/output (I/O) components 1116. The device 1100 may include additional features or components not shown. For example, the device 1100 may include a wireless interface, which may include a number of transceivers and a baseband processor for wireless communication. The device 1100 may also include a power supply 1118, which may be coupled to or integrated into the device 1100.

The transmitter 1101 and the receiver 1102 may be part of an active depth sensing system. For example, the transmitter 1101 may be a transmitter 202 and the receiver 1102 may be a receiver 204 of an indirect TOF system 200 in FIG. 2. The active depth sensing system may be controlled by the controller 1110 (such as signal processor 1112) and/or the processor 1104. The transmitter 1101 may include or be coupled to one or more power sources for adjusting a power to cause pulses or modulation of an emitted light. The receiver 1102 may be configured to receive reflections of the emitted light from the transmitter 1101.

The receiver 1102 may include one or more image sensors including a photodetector with a photosensitive surface including germanium. For example, the receiver 1102 may include an image sensor having an array of pixels, and each pixel may include a demodulation circuit having p-i-n photodiode with a germanium doped intrinsic layer. In some implementations, the photosensitive surface of a photodetector of a pixel may have a normal incidence for receiving light (the angle of incidence being 0).

While the active depth sensing system is depicted as including one receiver and one image sensor, any number of receivers or image sensors may be included in the active depth sensing system. For example, the active depth sensing system may include multiple image sensors for light sensing from different perspectives. Additionally, while the device 1100 is depicted as including one active depth sensing system, the device 1100 may include or be coupled to additional active depth sensing systems, and the disclosure is not limited to a device including one active depth sensing system. In some other implementations, the active depth sensing system may be a structured light system, and the transmitter 1101 and the receiver 1102 may be separated by a baseline for performing depth sensing.

The memory 1106 may be a non-transient or non-transitory computer readable medium storing computer-executable instructions 1108 to perform all or a portion of one or more device operations. The processor 1104 may be one or more suitable processors capable of executing scripts or instructions of one or more software programs (such as instructions 1108) stored within the memory 1106. In some aspects, the processor 1104 may be one or more general purpose processors that execute instructions 1108 to cause the device 1100 to perform any number of functions or operations. In additional or alternative aspects, the processor 1104 may include integrated circuits or other hardware to perform functions or operations without the use of software. For example, a TOF system may be a LIDAR system, and the device 1100 may be an apparatus for controlling navigation of a vehicle (such as a car or a UAV). A processor 1104 may execute instructions 1108 to cause the device 1100 to control navigation of the vehicle (such as speed, steering, acceleration, altitude, and so on) based on depth sensing from the active depth sensing system. The device 1100 may also be configured to alert a user (such as a driver or UAV operator) of obstacles or other events based on the depth sensing.

While shown to be coupled to each other via the processor 1104 in the example of FIG. 11, the processor 1104, the memory 1106, the controller 1110, the optional display 1114, and the optional I/O components 1116 may be coupled to one another in various arrangements. For example, the processor 1104, the memory 1106, the controller 1110, the optional display 1114, and the optional I/O components 1116 may be coupled to each other via one or more local buses (not shown for simplicity).

The display 1114 may be any suitable display or screen allowing for user interaction and/or to present items to a user (such as a depth map, a preview image of the scene, an alert, and so on). In some aspects, the display 1114 may be a touch-sensitive display. In some examples, the display 1114 may be a heads up display or center console display in an automobile, the display 1114 may be a display of a smartphone, digital camera, or other electronic device, or the display may be a display on a user controller for UAV.

The I/O components 1116 may be or include any suitable mechanism, interface, or device to receive external input and to provide output. In some implementations, the I/O components 1116 may include an interface to receive requests or commands from a user or to provide feedback to the user. In some other implementations, the I/O components 1116 may include an interface to receive feedback regarding operation of a device (such as a speed and other measurements of a vehicle). For example, the I/O components 1116 may include (but are not limited to) a graphical user interface, keyboard, mouse, microphone and speakers, squeezable bezel or border of a handheld device, physical buttons, an interface coupled to a communication network of an automobile, a UAV controller, and so on.

The controller 1110 may include a signal processor 1112, which may be one or more processors to process measurements provided by the receiver 1102 or control operation of the transmitter 1101 and the receiver 1102. In some aspects, the signal processor 1112 may execute instructions from a memory (such as instructions 1108 from the memory 1106 or instructions stored in a separate memory coupled to the signal processor 1112). In other aspects, the signal processor 1112 may include specific hardware for operation. The signal processor 1112 may alternatively or additionally include a combination of specific hardware and the ability to execute software instructions.

As noted, an image sensor of an active depth sensing system may include one or more photodetectors. Each photodetector may include a photosensitive surface that includes germanium to improve absorption of photons at higher wavelengths (such as greater than 1000 nanometer wavelength) than a pure silicon photosensitive surface. Operation of a photodetector including germanium may be similar to operation of a photodetector not including germanium. For example, a p-i-n photodiode with an intrinsic layer doped with germanium may operate in a similar manner than a p-i-n photodiode with an intrinsic layer not doped with germanium, except that the p-i-n photodiode with the germanium doped intrinsic layer may have a higher absorption efficiency of photons of specific wavelength light (such as a wavelength greater than 1000 nanometers). A p-i-n photodiode with an intrinsic layer of germanium crystals may have a higher absorption efficiency, than a photodiode including silicon in the intrinsic layer, of photons of wavelength light greater than 1400 nanometers.

Figure 12:
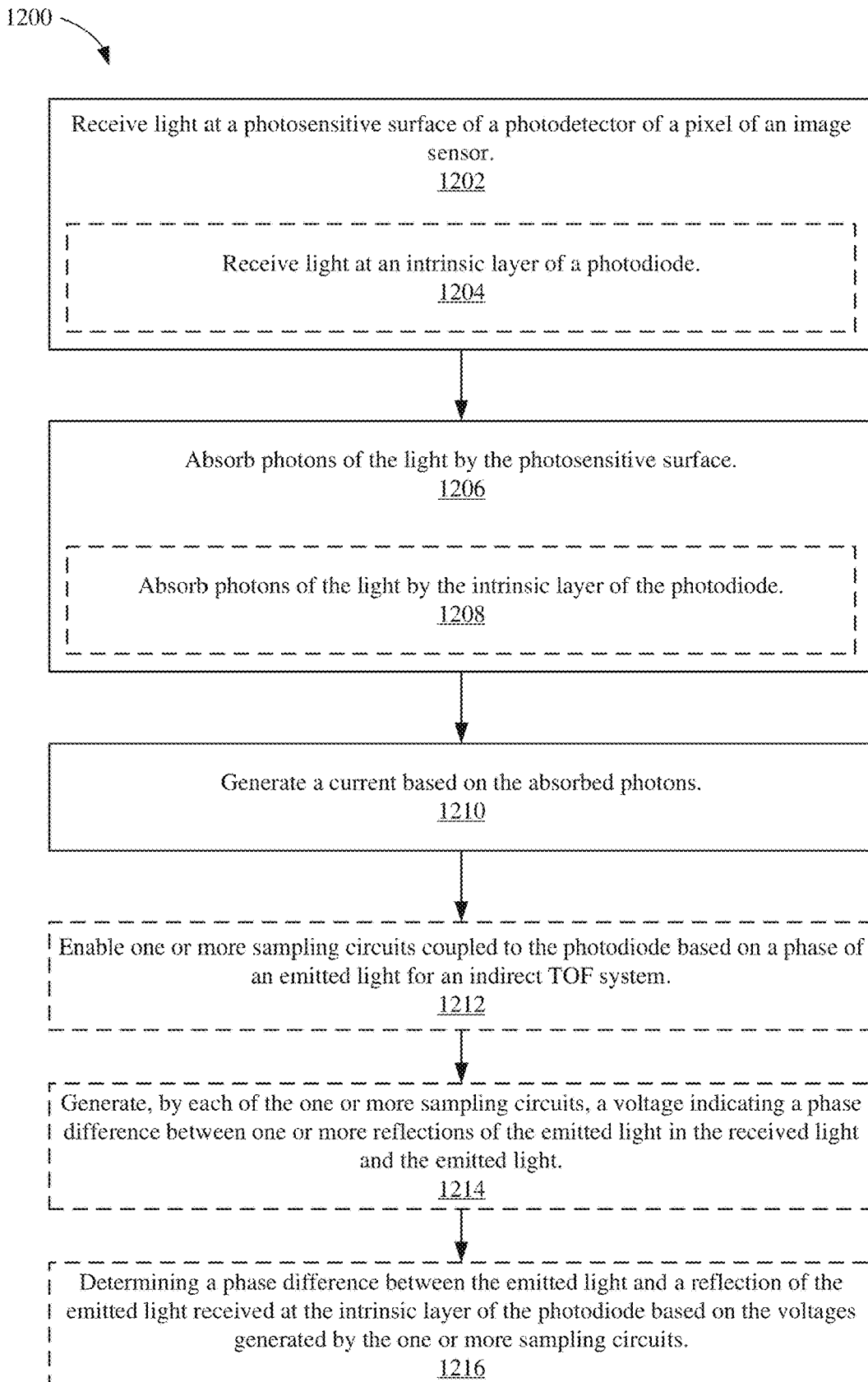
FIG. 12 is a flow chart depicting an example operation of an image sensor.

FIG. 12 is a flow chart depicting an example operation 1200 of an image sensor. The example image sensor includes a pixel including a photodetector with a photosensitive surface including germanium. At 1202, the photosensitive surface of the photodetector receives light. In some implementations, the light includes a reflection of emitted light for an active depth sensing system. For example, the light may include one or more reflections of a frequency modulated light having a first wavelength that is emitted for indirect TOF depth sensing. In some implementations, the photodetector may include a photodiode, and the photodiode may receive light at an intrinsic layer (1204). In some implementations, the intrinsic layer may be a silicon layer doped with germanium. In some other implementations, the intrinsic layer may be a germanium crystal layer. The intrinsic layer may be between a p− layer and an n− layer not doped with germanium or otherwise including germanium.

The photosensitive surface of the photodetector may absorb photons of the light (1206). In some implementations, the germanium doped intrinsic layer may absorb photons of the received light (1208). At 1210, the photodetector may generate a current based on the absorbed photons. For example, a photodiode may generate the current (such as described above with reference to FIG. 8). As noted, the current may vary depending on the intensity of the light received. If the light includes a reflection of the frequency modulated emitted light, the intensity of the light received varies based on the phase of the reflected light as received by the pixel.

In some implementations, an image sensor may enable one or more sampling circuits coupled to the photodiode (1212). Enablement may be based on a phase of the emitted light (such as from an indirect TOF transmitter). For example, referring back to FIG. 4, the transistors 404 and 406 may be activated based on a phased of the emitted signal 408 or the inverse emitted signal 410 (which may be a phase offset of the emitted signal 408). The one or more enabled sampling circuits may then generate a voltage indicating a phase difference between one or more reflections of the emitted light (as received in the received light) and the emitted light from the indirect TOF transmitter (1214). For example, if the current from the photodiode is below a threshold, an enabled sampling circuit may generate a low voltage signal. If the current from the photodiode is above the threshold, the enabled sampling circuit may generate a high voltage signal. Whether the current is above or below the threshold may correspond to the phase of the reflection of the emitted signal as received by the pixel. In this manner, the voltages may indicate a phase difference between the reflection of the emitted light and the emitted light.

In some implementations, an apparatus may determine a phase difference between the emitted light and a reflection of the emitted light as received at the pixel (such as at the intrinsic layer of the photodiode) (1216). Determining the phase difference is based on the voltages generated by the one or more sampling circuits. For example, for a four-phase demodulation pixel, the voltages generated by the four sampling circuits may be compared (such as which voltages are a low voltage and which voltages are a high voltage). A phase difference may then be determined based on the comparison.

As noted, an apparatus may determine a depth of a surface of an object from the pixel based on the phase difference. In some implementations, the depth may be used to control operation of a device. For example, the indirect TOF system may be a LIDAR system, and the LIDAR system may be used in controlling navigation of a vehicle (such as an automobile or a UAV). In some other implementations, depths may be determined to generate a depth map, provide depths to users, or other suitable applications for active depth sensing systems.

In the description, numerous specific details have been set forth, such as examples of specific components, circuits, and processes to provide a thorough understanding of the present disclosure. The term "coupled" as used herein means connected directly to or connected through one or more intervening components or circuits. Also, in the description and for purposes of explanation, specific nomenclature is set forth to provide a thorough understanding of the present disclosure. However, it will be apparent to one skilled in the art that these specific details may not be required to practice the teachings disclosed herein. In other instances, well-known circuits, systems, and devices are shown in block diagram form to avoid obscuring teachings of the present disclosure. Some portions of the detailed descriptions are presented in terms of procedures, logic blocks, processing and other symbolic representations of operations on data bits within a computer memory. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving," "settling" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example systems and devices may include components other than those shown, including well-known components such as a processor, memory and the like.

Aspects of the present disclosure are applicable to active depth sensing (such as TOF ranging), and may be included in or coupled to any suitable electronic device or system (such as security systems, smartphones, tablets, laptop computers, digital cameras, vehicles, drones, virtual reality devices, or other devices that may utilize depth sensing). While described with respect to a device having or coupled to one TOF system, aspects of the present disclosure are applicable to devices having any number or type of suitable active depth sensing systems.

The term "device" is not limited to one or a specific number of physical objects (such as one smartphone, one controller, one processing system and so on). As used herein, a device may be any electronic device with one or more parts that may implement at least some portion of this disclosure. While the description and examples use the term "device" to describe various aspects of this disclosure, the term "device" is not limited to a specific configuration, type, or number of objects. Additionally, the term "system" is not limited to multiple components or specific embodiments. For example, a system may be implemented on one or more printed circuit boards or other substrates, have one or more housings, be one or more objects integrated into another device, and may have movable or static components. While the description and examples use the term "system" to describe various aspects of this disclosure, the term "system" is not limited to a specific configuration, type, or number of objects.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software (such as a device altering the spatial pattern for an included structured light system), the techniques may be realized at least in part by a non-transitory processor-readable storage medium (such as the memory 1106 in the example device 1100 of FIG. 11) comprising instructions 1108 that, when executed by the processor 1104 (or the controller 1110 or the signal processor 1112), cause the device 1100 or the depth finding system to perform one or more of the methods described. The non-transitory processor-readable data storage medium (computer readable medium) may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

Some of the various illustrative logical blocks, modules, circuits and instructions described in connection with the embodiments disclosed herein may be executed by one or more processors, such as the processor 1104 or the signal processor 1112 in the example device 1100 of FIG. 11. Such processor(s) may include but are not limited to one or more digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structures or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

While the present disclosure shows illustrative aspects, it should be noted that various changes and modifications could be made herein without departing from the scope of the appended claims. For example, while the examples for the active depth sensing system are described regarding light emissions, signals at other frequencies may be used, such as microwaves, radio frequency signals, sound signals, and so on. Additionally, the functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated. Accordingly, the disclosure is not limited to the illustrated examples and any means for performing the functionality described herein are included in aspects of the disclosure.

What is claimed is:

1. An apparatus, comprising:
   an image sensor including one or more pixels, wherein each pixel of the one or more pixels includes a photodetector, wherein the photodetector includes a photodiode including:
   a p— layer not including germanium;
   an n— layer not including germanium;
   a photosensitive intrinsic layer positioned between the p— layer and the n— layer, wherein the photosensitive intrinsic layer includes germanium and is configured to generate a current;
   an n— well coupled to one of the photosensitive intrinsic layer or the n— layer, wherein the n— well is configured to receive the current; and
   a transmit field effect transistor configured to output the current from the n— layer.

2. The apparatus of claim 1, further comprising one or more processors configured to:
   determine a phase difference between emitted light and a reflection of the emitted light received at the photosensitive intrinsic layer of the photodiode based on voltages generated by one or more sampling circuits of at least one pixel of the image sensor; and
   determine a depth of a surface of an object from the at least one pixel of the image sensor based on the phase difference.

3. The apparatus of claim 1, wherein the photosensitive intrinsic layer includes at least one from the group consisting of:
   silicon doped with germanium; and
   germanium crystals without silicon.

4. The apparatus of claim 1, wherein the photodiode is one from the group consisting of:
   a vertical p-i-n photodiode; and
   a horizontal p-i-n photodiode.

5. The apparatus of claim 1, wherein the photodiode is configured to:
   receive one or more reflections of emitted light having a first wavelength for active depth sensing;
   absorb, by the photosensitive intrinsic layer of the photodiode, photons of the one or more reflections of emitted light; and
   generate the current based on the absorbed photons.

6. The apparatus of claim 5, wherein the first wavelength is greater than 1000 nanometers.

7. The apparatus of claim 5, wherein:
   active depth sensing includes indirect time-of-flight (TOF) depth sensing;
   each pixel includes one or more sampling circuits coupled to the photodiode; and
   each sampling circuit of the one or more sampling circuits is configured to be enabled at a different phase of the emitted light than for at least one other sampling circuit of the one or more sampling circuits.

8. The apparatus of claim 7, wherein each pixel is one from the group consisting of:
   a two-phase demodulation pixel;
   a three-phase demodulation pixel; and
   a four-phase demodulation pixel.

9. The apparatus of claim 8, wherein the image sensor includes an array of demodulation pixels.

10. The apparatus of claim 9, further comprising an indirect TOF receiver, wherein the indirect TOF receiver includes the image sensor.

11. The apparatus of claim 10, further comprising an indirect TOF transmitter configured to emit a frequency modulated light having the first wavelength, wherein operation of the one or more sampling circuits is based on a phase of the frequency modulated light.

12. The apparatus of claim 11, further comprising one or more processors coupled to the indirect TOF transmitter and the indirect TOF receiver to form an indirect TOF depth sensing system, wherein the one or more processors are configured to control operation of the indirect TOF transmitter and the indirect TOF receiver.

13. The apparatus of claim 12, wherein the indirect TOF depth sensing system is a light detection and ranging (LIDAR) system.

14. The apparatus of claim 13, wherein the LIDAR system is coupled to or included in a vehicle, wherein navigation of the vehicle is based on operation of the LIDAR system.

15. The apparatus of claim 14, wherein the first wavelength is greater than 1000 nanometers.

16. A method of operation, comprising:
   receiving light at an intrinsic layer of a photodiode of a photodetector of a pixel of an image sensor, wherein the intrinsic layer includes germanium and is positioned between a p— layer not including germanium and an n— layer not including germanium;
   absorbing photons of the light by the intrinsic layer;
   generating, by the intrinsic layer, a current based on the absorbed photons;
   receiving the current at an n— well coupled to one of the intrinsic layer or the n— layer; and
   outputting, by a transmit field effect transistor, the current from the n— layer.

17. The method of claim 16, wherein the photodiode is one from the group consisting of:
   a vertical p-i-n photodiode; and
   a horizontal p-i-n photodiode.

18. The method of claim 16, wherein the intrinsic layer includes at least one from the group consisting of:
   silicon doped with germanium; and
   germanium crystals without silicon.

19. The method of claim 16, wherein the light includes one or more reflections of emitted light having a first wavelength for active depth sensing.

20. The method of claim 19, wherein:
active depth sensing includes indirect time-of-flight (TOF) depth sensing; and
the emitted light is frequency modulated.

21. The method of claim 20, further comprising:
enabling one or more sampling circuits coupled to the photodiode based on a phase of the emitted light; and
generating, by each sampling circuit of the one or more sampling circuits, a voltage indicating a phase difference between the one or more reflections of the emitted light and the emitted light.

22. The method of claim 21, further comprising:
determining the phase difference between the emitted light and a reflection of the emitted light received at the intrinsic layer of the photodiode based on the voltages generated by the one or more sampling circuits; and
determining a depth of a surface of an object from the pixel of the image sensor based on the phase difference.

23. The method of claim 22, further comprising emitting the frequency modulated light having the first wavelength.

24. The method of claim 23, wherein the first wavelength is greater than 1000 nanometers.

25. The method of claim 24, further comprising controlling navigation of a vehicle based on the depth of the surface of the object from the pixel.

26. A non-transitory computer-readable medium storing instructions that, when executed by one or more processors of a device, cause the device to:
receive light at an intrinsic layer of a photodiode of a photodetector of a pixel of an image sensor of the device, wherein the intrinsic layer includes germanium and is positioned between a p- layer not including germanium and an n- layer not including germanium;
absorb photons of the light by the intrinsic layer;
generate, by the intrinsic layer, a current based on the absorbed photons;
receive the current at an n— well coupled to one of the intrinsic layer or the n— layer; and
output, via a transmit field effect transistor, the current from the n— layer.

27. The computer-readable medium of claim 26, wherein the intrinsic layer includes at least one from the group consisting of:
silicon doped with germanium; and
germanium crystals without silicon.

28. The computer-readable medium of claim 27, wherein execution of the instructions further causes the device to:
emit a frequency modulated light having a first wavelength for indirect time-of-flight (TOF) depth sensing, wherein the light received at the intrinsic layer of the photodiode includes one or more reflections of the emitted light;
enable one or more sampling circuits coupled to the photodiode based on a phase of the emitted light;
generate, by each of the one or more sampling circuits, a voltage indicating a phase difference between the one or more reflections of the emitted light and the emitted light; and
determine a phase difference between the emitted light and a reflection of the emitted light based on the voltages generated by the one or more sampling circuits.

29. The method of claim 21, further comprising:
emitting, via an indirect TOF transmitter, a frequency modulated light having the first wavelength, wherein operation of the one or more sampling circuits is based on a phase of the frequency modulated light.

30. The method of claim 29, further comprising:
controlling operation of the indirect TOF transmitter and an indirect TOF receiver comprising the image sensor.

* * * * *